United States Patent
Rahim et al.

(10) Patent No.: US 8,030,962 B2
(45) Date of Patent: Oct. 4, 2011

(54) CONFIGURATION RANDOM ACCESS MEMORY

(75) Inventors: Irfan Rahim, San Jose, CA (US); Andy L. Lee, San Jose, CA (US); Myron Wai Wong, Fremont, CA (US); William Bradley Vest, San Jose, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/868,575

(22) Filed: Aug. 25, 2010

(65) Prior Publication Data

US 2010/0321984 A1    Dec. 23, 2010

Related U.S. Application Data

(63) Continuation of application No. 11/653,001, filed on Jan. 12, 2007, now Pat. No. 7,800,400.

(51) Int. Cl.
*H03K 19/173* (2006.01)
(52) U.S. Cl. .......................................... 326/38
(58) Field of Classification Search .............. 326/37–41, 326/47, 101
See application file for complete search history.

(56) References Cited

U.S. PATENT DOCUMENTS

| | | | |
|---|---|---|---|
| 5,122,846 A | 6/1992 | Haken | |
| 5,642,315 A | 6/1997 | Yamaguchi | |
| 5,801,551 A | 9/1998 | Lin | |
| 6,025,737 A | 2/2000 | Patel | |
| 6,172,861 B1 * | 1/2001 | Ohta | ............................... 361/56 |
| 6,232,893 B1 | 5/2001 | Cliff | |
| 6,433,585 B1 | 8/2002 | Patel | |
| 6,724,222 B2 | 4/2004 | Patel et al. | |
| 6,795,332 B2 | 9/2004 | Yamaoka | |
| 6,897,679 B2 | 5/2005 | Cliff | |
| 2004/0233701 A1 * | 11/2004 | Turner | .......................... 365/154 |

OTHER PUBLICATIONS

"TSMC Embedded High Density Memory," Taiwan Semiconductor Manufacturing Company Ltd, May 2006.
Lin, Lin-Shih et al. U.S. Appl. No. 11/335,437, filed Jan. 18, 2006.

* cited by examiner

*Primary Examiner* — Shawki Ismail
*Assistant Examiner* — Thienvu Tran
(74) *Attorney, Agent, or Firm* — Treyz Law Group; G. Victor Treyz; Nancy Y. Ru

(57) ABSTRACT

Integrated circuits such as programmable logic device integrated circuits are provided that have configuration random-access memory elements. The configuration random-access memory elements are loaded with configuration data to customize programmable logic on the integrated circuits. Each memory element has a capacitor that stores data for that memory element. A pair of cross-coupled inverters are connected to the capacitor. The inverters ensure that the memory elements produce output control signals with voltages than range from one power supply rail to another. Each configuration random-access memory element may have a clear transistor. The capacitor may be formed in a dielectric layer that lies above the transistors of the inverters, the address transistor, and the clear transistor. The inverters may be powered with an elevated power supply voltage.

20 Claims, 8 Drawing Sheets

CONFIGURATION RANDOM ACCESS MEMORY

This application is a continuation of patent application Ser. No. 11/653,001, filed Jan. 12, 2007 now U.S. Pat. No. 7,800,400, which is hereby incorporated by referenced herein in its entirety.

BACKGROUND

This invention relates to volatile memory elements, and more particularly, to random access memory for integrated circuits such as configuration random access memory for programmable logic device integrated circuits.

Integrated circuits often contain volatile memory elements. In programmable logic devices, volatile memory elements are used to store configuration data. This type of memory is often referred to as configuration random-access memory (CRAM).

Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the configuration random-access memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Conventional configuration random-access memory elements are formed using six-transistor cells. As semiconductor manufacturing technology improves, it is becoming possible to fabricate the transistors that make up the memory elements with increasingly small dimensions. It is generally desirable to shrink component sizes as much as possible to reduce costs and improve performance. It is may also be desirable to operate components at reduced power supply voltages to minimize power consumption.

As components shrink in size and as power supply voltages scale, a number of factors arise that can adversely impact memory element stability.

Memory element stability is affected by the amount of noise on each transistor. Noise may be produced by particle strikes such as strikes by neutrons or alpha particles. Noise may also be capacitively coupled into a memory element from nearby circuitry. When noise from these sources is introduced into a memory element, the memory element can erroneously change its state.

Memory element stability is also affected by transistor threshold voltage variations. Threshold voltage variations are a statistical byproduct of the discrete nature of the ions used when forming implant regions for a transistor.

To ensure that these factors do not make the memory elements unstable, conventional random-access memory elements have transistors with enlarged areas (i.e., enlarged gate widths). Transistors with enlarged areas store more critical charge than smaller transistors and are therefore less susceptible to noise such as noise from particle strikes. Transistors with enlarged areas are also less susceptible to threshold voltage variations and are better able to avoid interference from read and write operations performed on adjacent memory elements.

However, the need to increase the sizes of the transistors in conventional configuration random-access memory elements has an adverse impact on circuit real estate consumption. On a typical programmable logic device integrated circuit, the area consumed by the configuration random-access memory elements may be a significant fraction of the total area of the integrated circuit. As a result, the area penalty that is imposed by the need to enlarge transistor sizes to ensure adequate memory element stability may be nonnegligible.

It would therefore be desirable to be able to provide improved configuration random-access memory elements.

SUMMARY

In accordance with the present invention, integrated circuits such as programmable logic device integrated circuits are provided that contain configuration random-access memory elements. A programmable logic device integrated circuit contains programmable logic. During device programming, configuration data is loaded into the configuration random-access memory elements. When loaded, the configuration random-access memory elements produce static output signals corresponding to the loaded configuration data. The static output signals are applied to the gates of transistors in the programmable logic to turn the transistors on and off as appropriate.

The configuration random-access memory elements make efficient use of circuit real estate. Each random-access memory element has an address transistor and may have a clear transistor. The address transistor has a gate that is connected to a corresponding address line. The address line is asserted when writing or reading the memory element over an associated data line. The address transistor has a first source-drain terminal that is coupled to the associated data line and a second source-drain terminal that is connected to a data node. Each configuration random-access memory element also has a data storage capacitor that is connected between the data node and a capacitor ground terminal. A pair of cross-coupled inverters are connected to the data node and help ensure that data is retained on the data node.

The programmable logic on the integrated circuit may be powered at a core logic power supply voltage. To ensure that the static output signals from the configuration random-access memory elements are strong enough to properly control the programmable logic transistors, the configuration random-access memory elements may be powered with an elevated power supply voltage. For example, the transistors in the inverters may be powered with a positive power supply voltage that is greater than the core logic power supply voltage.

Further features of the invention, its nature and various advantages will be more apparent from the accompanying drawings and the following detailed description of the preferred embodiments.

DETAILED DESCRIPTION

The present invention relates to memory elements such as configuration random-access memory elements for integrated circuits such as programmable logic device integrated circuits. If desired, the memory elements may be formed on other integrated circuits, such as digital signal processing circuits with arrays of memory elements, microprocessors with memory elements, application specific integrated circuits with memory elements, etc. For clarity, the present invention will generally be described in the context of programmable logic device integrated circuits and programmable logic device configuration random-access memory elements.

Figure 1:
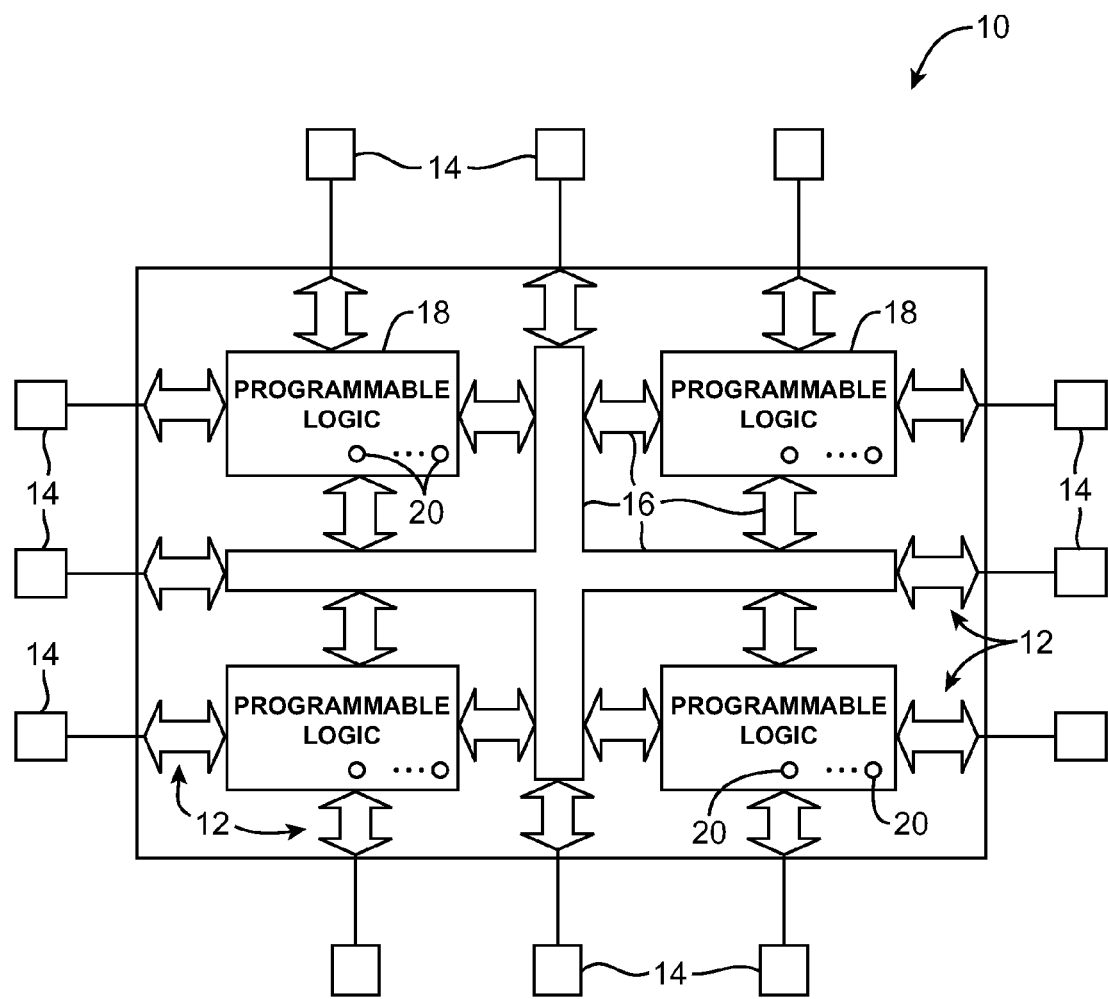
FIG. 1 is a diagram of an illustrative programmable logic device integrated circuit in accordance with an embodiment of the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally n-channel metal-oxide-semiconductor (NMOS) pass transistors in programmable components such as multiplexers, logic gates such as AND gates, NAND gates, etc. When a memory element output that is associated with an NMOS pass transistor is high, the pass transistor controlled by that memory element is turned on and passes logic signals from its input to its output. When the memory element output is low, the pass transistor is turned off and does not pass logic signals. P-channel metal-oxide-semiconductor transistors can also be controlled by memory element output signals.

Memory elements 20 may be formed using complementary metal-oxide-semiconductor (CMOS) integrated circuit technology or using any other suitable fabrication technique. In the context of programmable logic device integrated circuits, the memory elements store configuration data and are therefore sometimes referred to as configuration random-access memory (CRAM) cells.

Configuration random-access memory elements 20 are generally arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control (e.g., turn on and off) portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
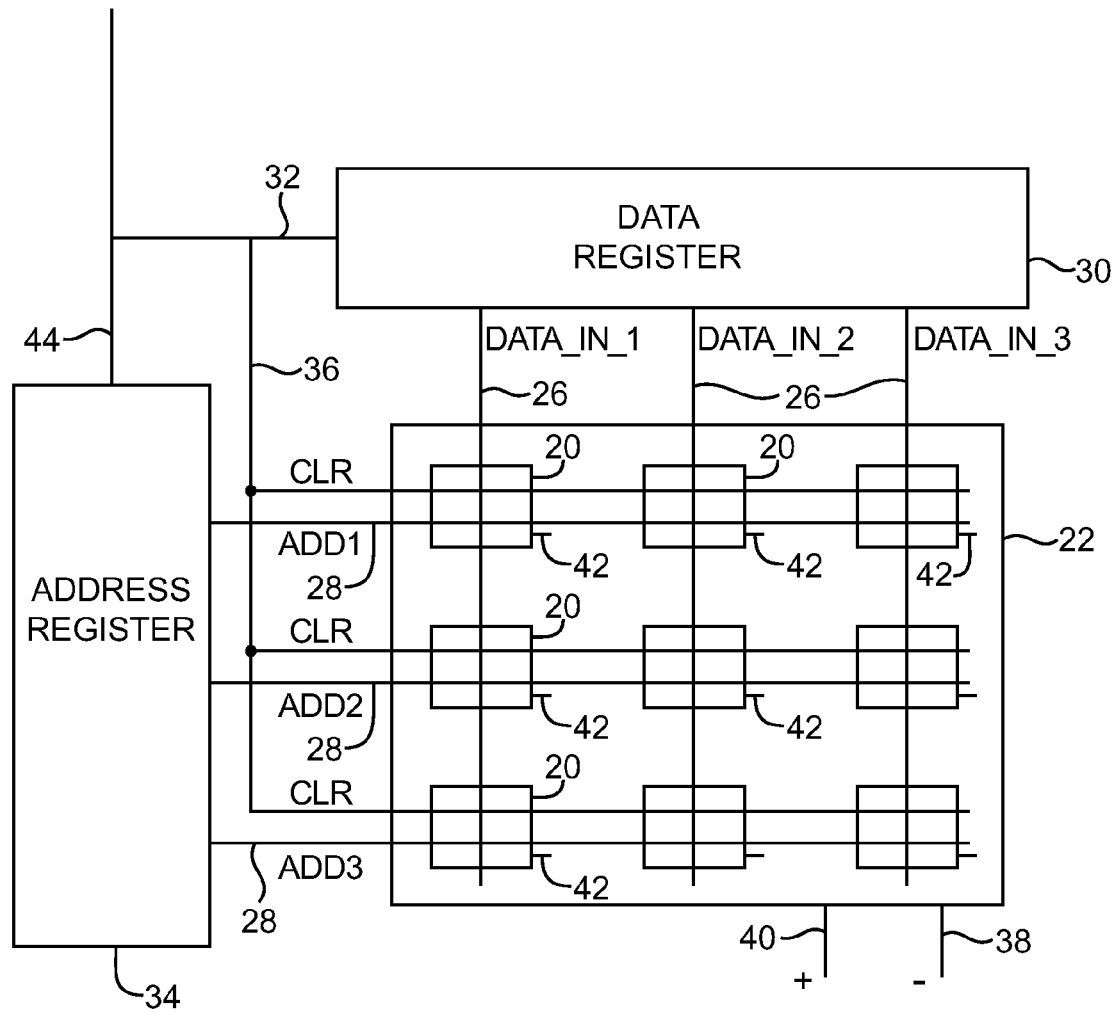
FIG. 2 is a diagram of an array of programmable logic device configuration random-access memory elements in accordance with an embodiment of the present invention.

An illustrative data loading arrangement that may be used to load an array of configuration random-access memory elements 20 on a programmable logic device 10 is shown in FIG. 2. The arrangement of FIG. 2, has a 3×3 array 22 of memory elements 20. Actual memory arrays typically have hundreds or thousands of rows and columns. The 3×3 array of FIG. 2 is used as an example.

The array 22 receives power via positive power supply line 40 and ground line 38. The ground voltage Vss on ground line 38 is typically 0 volts. A positive power supply voltage Vcc may be applied to positive power supply line 40. In a typical programmable logic device 10, core logic in the device is powered using a power supply voltage of 1.2 volts (sometimes referred to as Vcc-core). Programmable logic 18 that is used in implementing the custom design for programmable logic device 10 is part of the core logic and operates at Vcc-core. In some programmable logic devices 10, power supply voltages lower than 1.2 volts may be used (e.g., 1.1 volts, 1.0 volts, less than 1.0 volts, etc.). Peripheral circuitry may be powered using elevated power supply voltages. The power supply voltage level Vcc that is used in powering array 22 may be less than Vcc-core, may be equal to Vcc-core, or may be greater than Vcc-core. If desired, the value of Vcc may be varied as a function of time. For example, Vcc may be lowered during data writing operations and may be raised during normal operation.

An advantage of arrangements in which Vcc is elevated (i.e., when Vcc is greater than Vcc-core during normal operation) is that this results in static control signals at the memory element outputs that are elevated. Elevated static control signals may be applied to the gates of n-channel pass transistors in programmable logic 18 (as an example), thereby more fully turning these n-channel devices on than would otherwise be possible.

An optional clear line 36 (labeled CLR) may be used to clear the contents of the memory array 22. After the array has been cleared, configuration data may be loaded.

Configuration data may be provided in series to data registers 30 via input 32. The configuration data may then be provided in parallel to array 22 via the DATA_IN_1, DATA_IN_2, and DATA_IN_3 lines 26. Address register 34 receives addressing information via input 44. In response, the address register asserts a desired one of the address lines 28 (i.e., ADD1, ADD2, or ADD3). When an address line is asserted in a given row, the data on the data lines 26 is loaded into the memory elements 24 in that row. The array may be filled by systematically loading the memory elements in each of the rows of the array. After the array has been completely loaded with configuration data, the output 42 of each memory element 24 produces a corresponding static control signal for controlling the gate of a pass transistor or other logic component on the programmable logic device.

Figure 3:
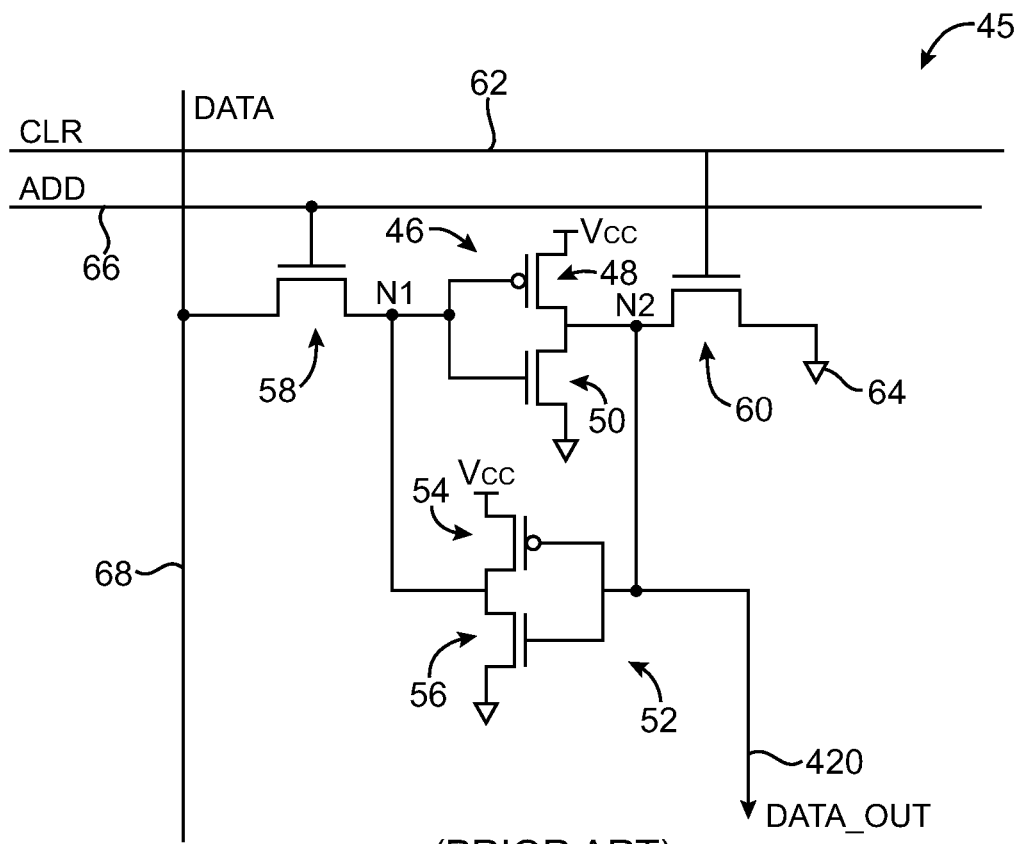
FIG. 3 is a diagram of a conventional six-transistor programmable logic device memory element.

A conventional configuration random-access memory element 45 of the type that can be used in an array of elements on a programmable logic device is shown in FIG. 3. As shown in FIG. 3, the memory element 45 is formed from two cross-coupled inverters—inverter 46 and inverter 52. Inverter 46 has a p-channel metal-oxide-semiconductor (PMOS) transistor 48 and an n-channel metal-oxide-semiconductor (NMOS) transistor 50. Inverter 52 has PMOS transistor 54 and NMOS transistor 56. The NMOS transistor 60 is turned on during clear operations by activating clear line 62. This connects node N2 to ground 64 and clears the memory element 45. The output of the memory element on line 420 (DATA_OUT) is determined by the signal on node N2.

When address line 66 is taken high, NMOS transistor 58 is turned on and the signal on data line 68 is driven into the memory element 45. If the signal on line 68 is high, node N1 remains high and the memory element 45 remains in its low (cleared) state. The output DATA_OUT in this situation is low. If the signal on line 68 is low, node N1 is taken low and, due to the inversion of the low N1 signal by inverter 46, the voltage on node N2 is taken high. This makes the output DATA_OUT high.

The DATA_OUT signal is typically applied to the gate of a transistor in a multiplexer, an AND gate, an OR gate, or other suitable logic gate in the programmable interconnect logic or other programmable logic of a programmable logic device. Typically, DATA_OUT is applied to the gate of an n-channel MOS pass gate. In this type of situation, the pass transistor is turned off when DATA_OUT is low. When DATA_OUT is high, the pass transistor is turned on.

For satisfactory operation, the voltage on node N2 (i.e., the signal DATA_OUT) should swing from one voltage supply rail to the other. If the voltage on node N2 does not swing from rail to rail, the transistor being controlled by the DATA_OUT signal will not fully turn on and off, thereby leading to leakage currents and undesirable power loss.

The conventional configuration random-access memory element of FIG. 3 works satisfactorily, but consumes a relatively large amount of real estate. This is because the transistors in conventional configuration random-access memory element 45 are fabricated with relatively large dimensions to ensure that memory element 45 exhibits stable operation. The gate widths of the transistors in elements such as element 45 of FIG. 3 are typically several times larger than the minimum possible width permitted by the fabrication technology being used.

Figure 4:
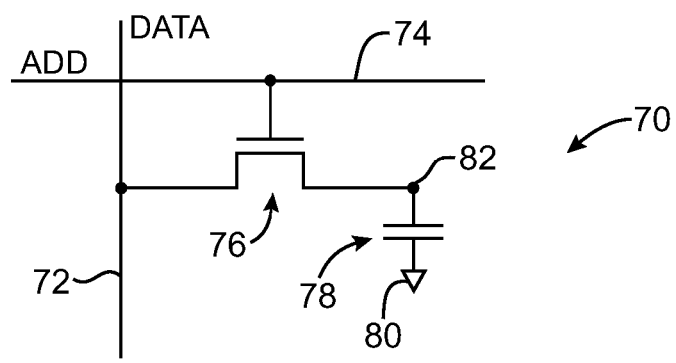
FIG. 4 is a diagram of a conventional dynamic random-access memory element.

Other types of memory elements may be fabricated with more compact dimensions. As an example, conventional dynamic random-access memory (DRAM) cells can be fabricated with more compact dimensions than conventional configuration random-access memory elements of the type shown in FIG. 3. A typical conventional dynamic random-access memory cell 70 is shown in FIG. 4. DRAM cell 70 uses capacitor 78 to store data. The contents of cell 70 is represented by the voltage on node 82. When capacitor 78 is charged and node 82 is high, cell 70 is said to contain a one. When capacitor 78 is discharged and node 82 is low, cell 70 is said to contain a zero. Capacitor 78 may be, for example, a trench capacitor. Capacitor 78 is connected to ground 80.

A single transistor 76 may be used to address the cell. To store data that is present on data line 72 in cell 70, address line 74 is asserted. This turns on address transistor 76 and drives the value on data line 72 onto capacitor 82. For example, if the data on line 72 is a logic low, capacitor 78 will discharge, thereby taking its associated charge to zero. If the data on line 72 is high during a write operation, a high signal will be driven onto capacitor 78, thereby charging capacitor 78.

To read the contents of cell 70, read circuitry is used to monitor the condition of line 72 while address line 74 is asserted. If a zero is stored in cell 78, line 72 will be pulled low. If a one is stored in cell 70, line 72 will be pulled high. Read operations are destructive, so following a read operation, the data stored in cell 70 must be regenerated. The charge stored on capacitor 78 is also subject to leakage currents, so there is a need to constantly refresh the contents of cell 70.

Because the charge on node 82 may fluctuate due to leakage current effects and due to ground noise effects on ground terminal 80, cell 70 is not suitable for supplying static output control signals on a programmable logic device. Any fluctuation or interruption in the voltage on node 82 would be immediately translated into a potential state change for a transistor whose gate is connected to node 82. Moreover, the constant need to refresh the state of cells such as cell 70 would impose an undesirable burden on a DRAM-type configuration random-access memory element. For these reasons, DRAM cells such as cell 70 of FIG. 4 are not suitable for use as configuration random-access memory.

Figure 5:
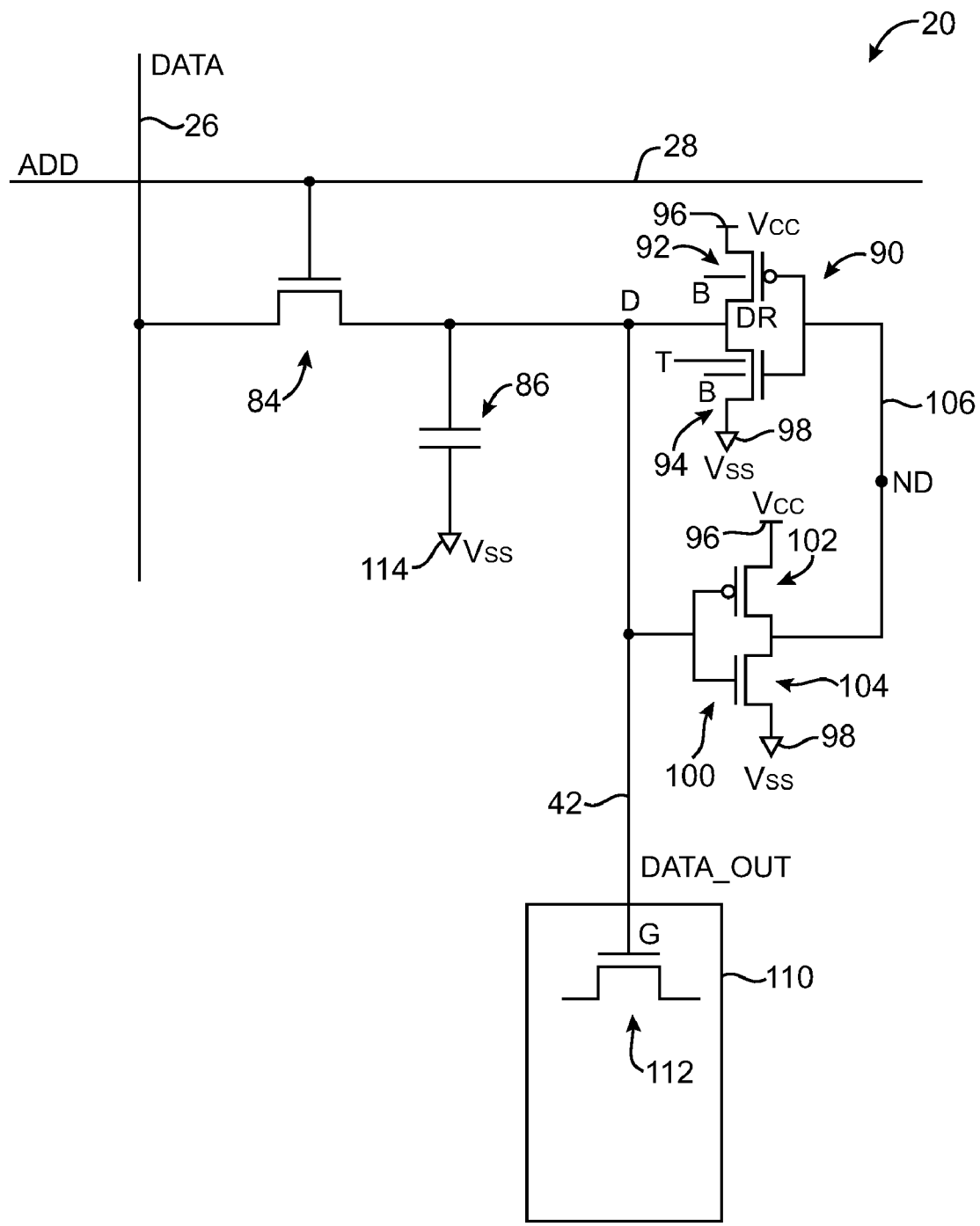
FIG. 5 is a diagram of a configuration random-access memory element in accordance with an embodiment of the present invention.

A configuration random-access memory element 20 in accordance with an embodiment of the present invention is shown in FIG. 5. Configuration random-access memory element 20 may be used in an array 22 of the type shown in FIG. 2. As shown in FIG. 5, the memory element 20 has cross-coupled inverters 90 and 100. The input of inverter 100 is connected to the output of inverter 90 via a conductive output line 42 (e.g., a metal line). The input of inverter 90 is connected to the output of inverter 100 via conductive line 106 (e.g., a metal line).

Inverter 90 has a p-channel metal-oxide-semiconductor (PMOS) transistor 92 and an n-channel metal-oxide-semiconductor (NMOS) transistor 94. Inverter 100 has PMOS transistor 102 and NMOS transistor 104. Inverters 90 and 100 are powered using positive power supply signal Vcc at positive power supply terminals 96 and ground signal Vss at ground terminals 98. In a typical scenario, Vcc is greater than the core logic voltage Vcc-core on device 10 during normal operation. For example, if Vcc-core is 1.2 volts, Vcc may be 1.6 volts (as an example). If desired, Vcc may be less than Vcc-core or may be equal to Vcc-core. The value of Vcc may also be varied as a function of time. For example, Vcc may be lowered during write operations to facilitate writing by weakening inverters 90 and 100 relative to a clear transistor or an address transistor such as address transistor 84. The value of Vcc may then be raised during normal operation. The value of Vss may be 0 volts (as an example). No clear transistor is used in the embodiment of FIG. 5 but may be used if desired.

When address line 28 is taken high, NMOS transistor 84 is turned on and the signal on data line 26 is driven into the memory element 20. When a high signal is driven into cell 20, capacitor 86, which is connected between data node D and ground terminal 114, is charged. When a low signal is driven into cell 20, capacitor 86 is discharged.

If the signal on line 26 is high when address line 28 is taken high, node D is driven high. Inverter 90 inverts the high signal and takes node ND on line 106 low. The value of the signal on node D becomes the signal DATA_OUT that is supplied on output line 42.

If the signal on line 26 is low when address line 28 is taken high, node D and the DATA_OUT signal are taken low and, due to the inversion of the low D signal by inverter 100, the voltage on node ND is taken high. This makes the output DATA_OUT high.

The charge stored on capacitor 86 represents the contents of cell 20 (D). Due to the presence of cross-coupled inverters 90 and 100, the value of D swings fully between the power supply rails. The value ND is the inverse of D due to inverter 100. When D is low, ND is high, which turns on NMOS transistor 94 and pulls D to the lower power supply rail (Vss) on the ground terminal 98 of inverter 90. When D is high, ND is low, which turns on PMOS transistor 92 and pulls node D to the voltage Vcc on the positive power supply terminal 96 of inverter 90 (i.e., the upper power supply rail for cell 20). By selecting a value of Vcc that is sufficiently large (typically a Vcc value that is equal to Vcc-core or that is elevated with respect to Vcc-core), the maximum value of the signal on node D can be assured of reaching a relatively high voltage.

If cross-coupled inverters 90 and 100 were not used in cell 20, capacitor 86 would not be capable of retaining its charge. This is because leakage currents (e.g., leakage currents through transistor 84, capacitor 86, and transistor 112) would cause the charge on capacitor 86 to drain away in the absence of an active refresh operation. With the arrangement of FIG. 5, transistors 92 and 94 in inverter 90 supply current to counteract these leakage currents and actively hold D at its desired level.

The DATA_OUT signal is typically applied to an electrical component 110 to configure that component to perform its desired function. With one suitable arrangement, the DATA_OUT signal is applied to the gate of a transistor such as gate G of transistor 112. Transistor 112 may be part of a multiplexer, an AND gate, an OR gate, or other suitable logic gate in device 10. The logic in which transistor 112 is contained may be general purpose programmable logic or may be programmable logic (e.g., a multiplexer) that is associated with interconnects 16. The static output control signal DATA_OUT is often applied to the gate of an n-channel MOS pass transistor. In this type of situation, the pass transistor is turned off when DATA_OUT is low and is turned on when DATA_OUT is high.

If desired, a p+ tap T may be provided in the p-type semiconductor substrate that forms NMOS transistor 94. This tap prevents a latch up condition from occurring. Without the p+tap, it might be possible for a p-n junction formed by the p-type drain DR of transistor 92 and the n-well body B from which transistor 92 is constructed to become strongly forward biased during shut-down operations. The forward bias of this junction may inject carriers that can cause latch up. The tap ensures that latch up will not occur and allows elements 20 to be automatically cleared during power down operations through transistor 92 in inverter 90.

The capacitance of capacitor 86 may be (as an example) about 12 fF. The presence of the capacitance of capacitor 86 unbalances memory element 20, so that all of the elements 20 in array 22 will automatically power up in a configuration in which they contain a logic zero (i.e., D is 0).

Because array 22 is cleared automatically during power up due to the unbalanced arrangement between nodes D and ND, there is no need for a clear line to clear the memory element 20 of FIG. 5. If desired, memory array 22 can be cleared by loading zeros into each element 20 (e.g., by placing zeros on data lines 26 while systematically asserting address lines 28).

During normal addressing operations in array 22, a desired ADD signal on one of lines 28 is asserted while an appropriate data line 26 is used to drive data into an element 20. By using a relatively wide gate width for transistor 84, address transistor 84 is assured of being stronger than inverter 90, which ensures that the data from data line 26 will be successfully driven onto capacitor 86 and node D. Inverter 100 may have approximately the same strength as inverter 90 (as an example).

The arrangement of FIG. 5 can considerably reduce the amount of integrated circuit real estate that is required to form a configuration random-access memory element. In a conventional random-access memory element arrangement of the type shown in FIG. 3 formed using 65 nm process technology, the gate widths of the transistors in inverters 46 and 56 might be increased to 0.22 µm from a nominal minimum value of 0.08 µm permitted by the process. Gate lengths might be about 0.065 µm.

In contrast, with the arrangement of FIG. 5, the gate widths of the transistors in inverters 90 and 100 can be 0.08 µm or less in 65 nm process technology. As a result, the area of memory elements formed using the arrangement of FIG. 5 are approximately 0.2 µm$^2$ versus approximately 0.6 µm$^2$ for conventional memory elements of the type shown in FIG. 3. Additional area savings may be achieved by eliminating the clear transistor from the memory element. Area can also be used efficiently by forming capacitor 86 above the transistor structures of transistors 84, 92, 94, 102, and 104.

Figure 6:
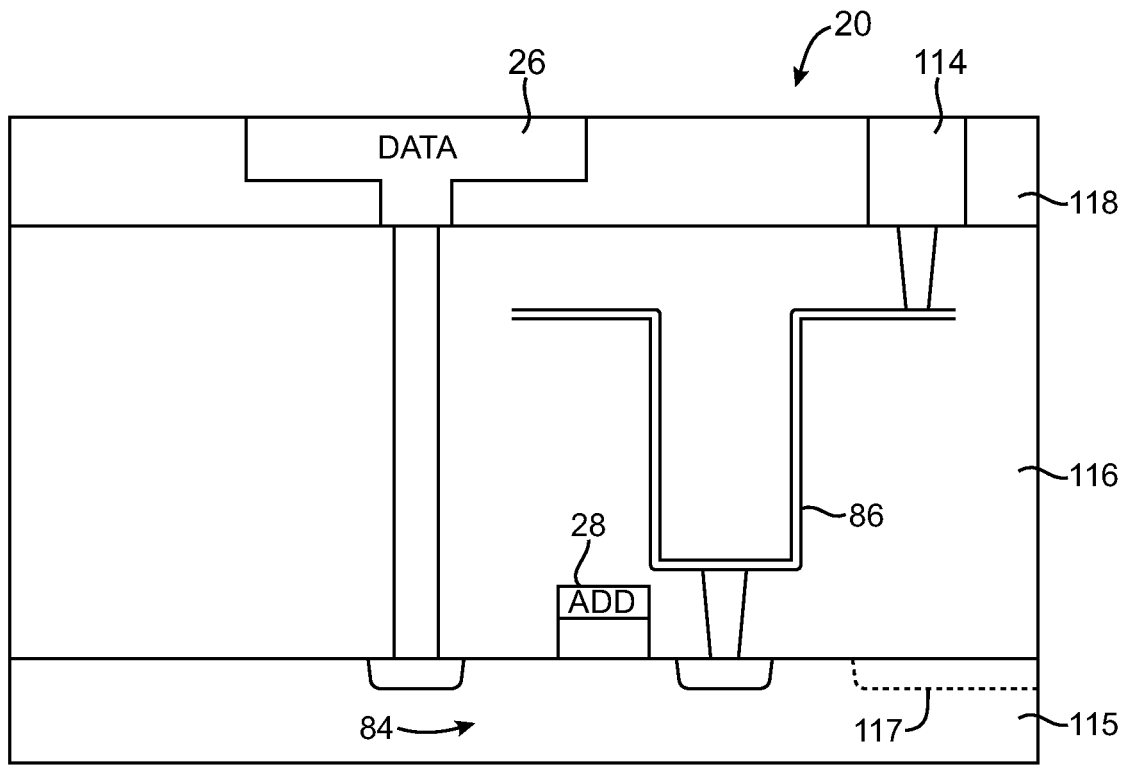
FIG. 6 is a cross-sectional side view of a portion of an integrated circuit containing a configuration random-access memory element in accordance with an embodiment of the present invention.

This type of arrangement is shown in FIG. 6. FIG. 6 shows a cross-sectional side view of a portion of an illustrative configuration random-access memory element 20 of the type shown in FIG. 5. Memory element 20 of FIG. 6 may be formed on a silicon substrate 115. Transistors such as transistor 84 and the transistors of the cross-coupled inverters and other devices are formed in silicon substrate 115. Transistor 84 is shown in FIG. 6. Dotted line 117 shows where some of the other transistor structures may be formed (as an example).

A dielectric stack is formed above substrate 115 and the devices formed in substrate 115. The dielectric stack includes dielectric layers such as dielectric layer 116 and metal layers such as metal layer 118. As shown in FIG. 6, capacitors such as capacitor 86 can be formed within one of the dielectric layers (i.e., layer 116). This type of capacitor structure is sometimes referred to as a metal-insulator-metal (MIM) capacitor structure because it may use two metal electrodes.

Because most of the capacitor is formed directly above devices in substrate 115, capacitors of this type need not consume any excess circuit real estate.

Figure 7:
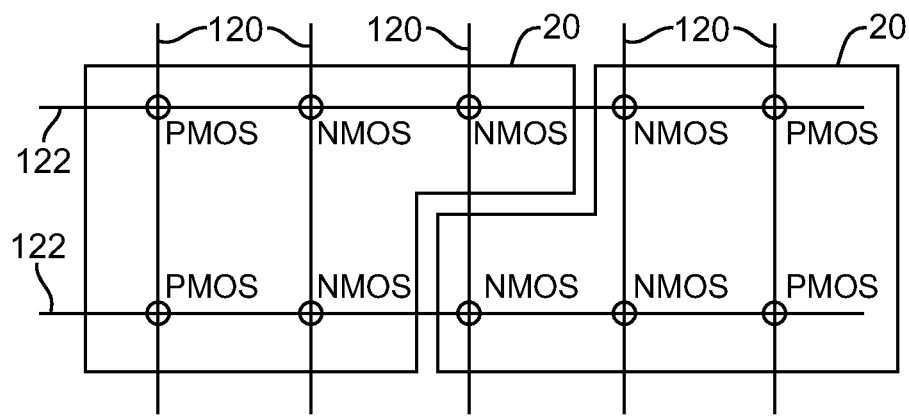
FIG. 7 is a top view of an illustrative layout pattern that may be used for forming two configuration random-access memory elements in accordance with an embodiment of the present invention.

An illustrative layout that may be used to form the transistors of two illustrative configuration random-access memory elements 20 is shown in FIG. 7. In the example of FIG. 7, horizontal lines 122 represent possible polysilicon gate line locations whereas vertical lines 120 represent possible channel (active) regions for transistors 92, 94, 102, 104, and 84 of FIG. 5. In each element 20 of FIG. 7, there are three NMOS transistors (transistors 94, 104, and 84 of FIG. 5) and two PMOS transistors (transistors 92 and 102 of FIG. 5). Layout efficiency can be enhanced by interleaving pairs configuration random-access memory elements 20 as shown in FIG. 7.

Figure 8:
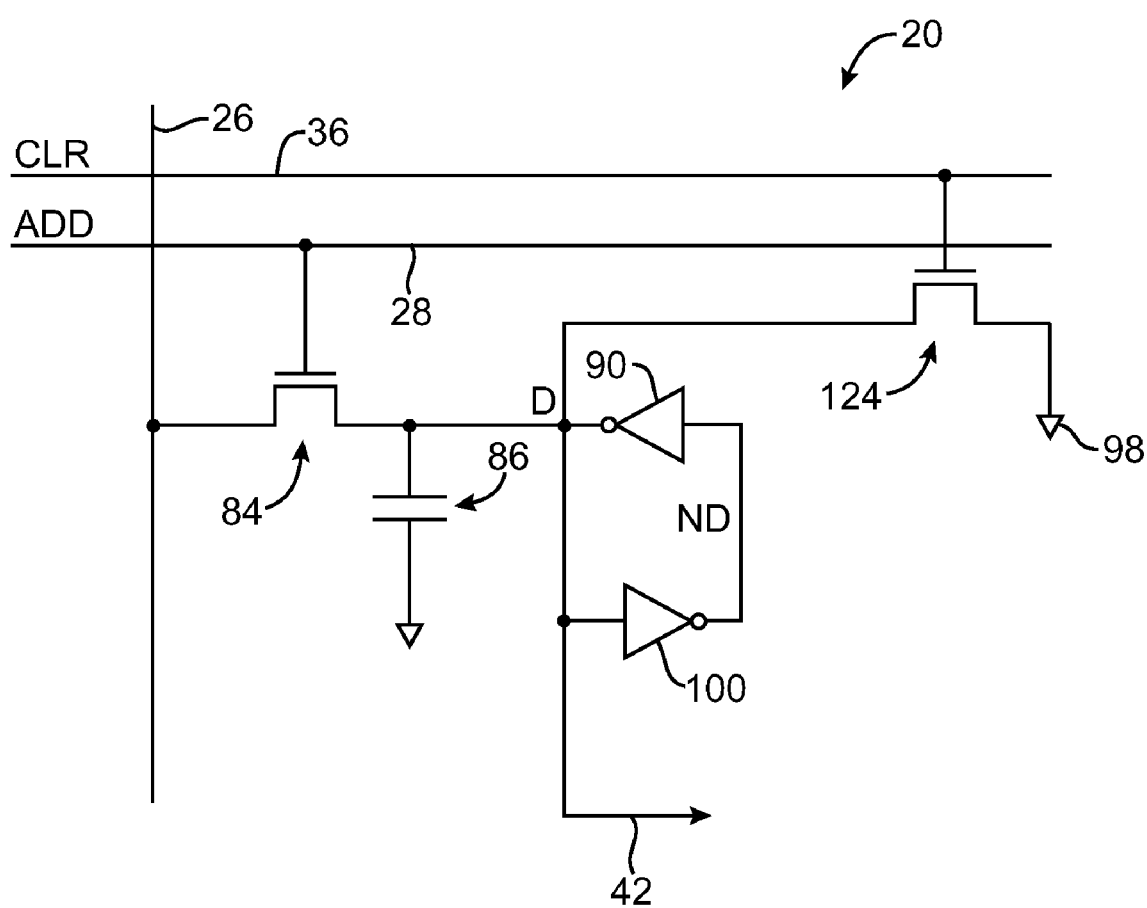
FIG. 8 is a diagram of a configuration random-access memory element having an associated clear line in accordance with an embodiment of the present invention.

If desired, memory element 20 may be provided with a clear line, as shown in FIG. 8. As shown in FIG. 8, configuration random-access memory element 20 may have a clear transistor 124. Clear transistor 124 may be a metal-oxide-semiconductor (MOS) transistor having a gate, drain, and source. The drains and sources of transistors such as transistor 124 and the other transistors in elements 20 and device 10 are sometimes referred to as source-drains. As shown in FIG. 8, one source-drain of transistor 124 is connected to ground terminal 98 and the other source-drain of transistor 124 is connected to node D. The gate of transistor 124 is connected to clear line 36. When it is desired to clear array 22, the clear line 36 can be asserted, connecting the node D in each element 20 of array 22 to ground terminal 98.

Figure 9:
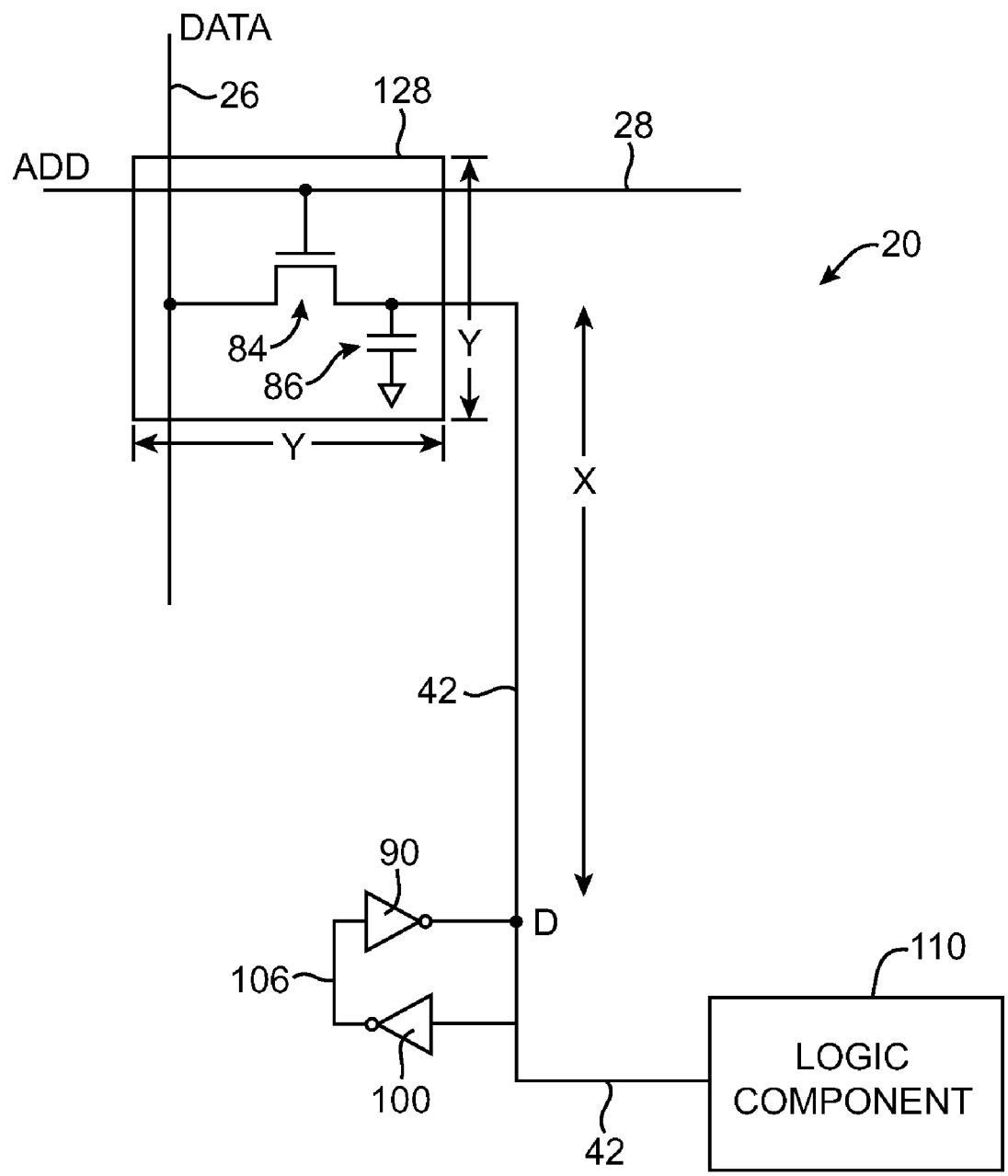
FIG. 9 is a diagram showing how the cross-coupled inverters in a configuration random-access memory element can be located at a position on an integrated circuit that is relatively remote from the other portions of the configuration random-access memory element in accordance with an embodiment of the present invention.

Cross-coupled inverters 90 and 100 need not be located adjacent to the other structures in configuration random-access memory element 20. This is illustrated in FIG. 9. In the example of FIG. 9, address transistor 84 and capacitor 86 have been fabricated within a square surface area 128 with lateral dimensions Y. The area of area 128 is $Y^2$. In a typical 65 nm process example, area 128 may be equal to about 0.2 $\mu m^2$ or less (i.e., Y may be about 0.45 μm). Due to layout considerations, it may not be convenient or practical to locate programmable logic component 110 immediately adjacent to capacitor 86 and address transistor 84. Accordingly, as shown in the FIG. 9 example, logic component 110 (e.g., a pass transistor) may be located at a distance X from capacitor 86 and address transistor 84. The value of X may be, as an example, 2 μm or more, 4 μm or more, 8 μm or more, 12 μm or more, etc. Cross-coupled inverters 90 and 100 may be located adjacent to logic component 110 (as shown in FIG. 9), may be located adjacent to address transistor 84 and capacitor 86 (as shown in FIG. 5) or may be located at an intermediate location or other suitable location.

An advantage of using a memory element arrangement of the type shown in FIG. 5 is that only five transistors are used—address transistor 84 and the four transistors of inverters 90 and 100. Because no clear transistor is used (in this arrangement), the amount of surface area that is consumed by element 20 is minimized.

The p+ tap T in inverter 90 may be used to avoid placing the transistors in a latch up condition as the capacitor discharges when powering down array 22. Upon power up, the presence of capacitor 86 on the data node D makes cross-coupled inverters 90 and 100 unbalanced and ensures that data node D will power up in a known (zero) state. The cell architecture of FIG. 5 therefore automatically clears itself when cycled through a power-down and power-up sequence without the need for a clear transistor.

Figure 10:
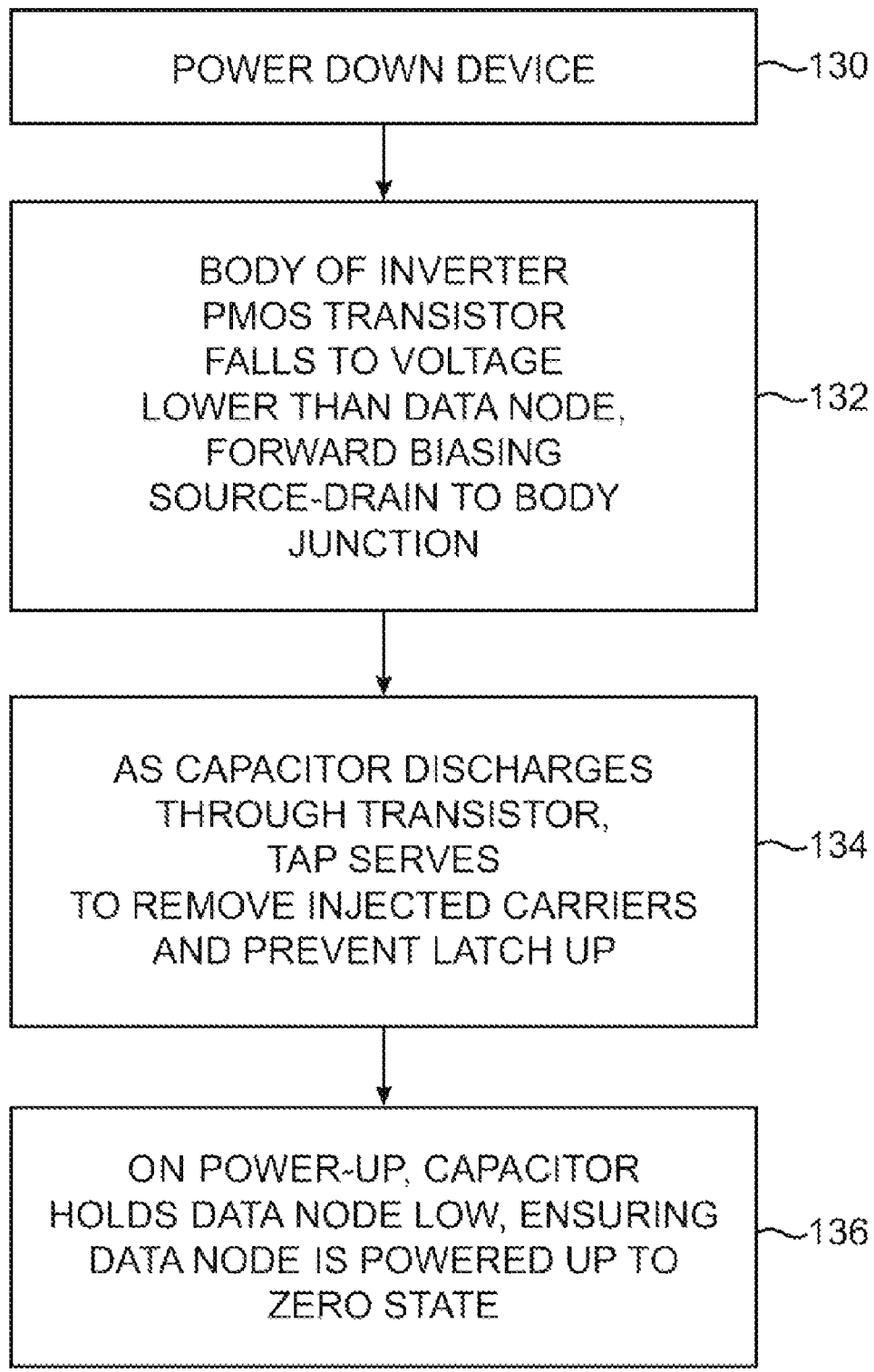
FIG. 10 is a flow chart of illustrative steps involved in clearing an array of configuration random-access memory elements when no clear transistor are used in accordance with an embodiment of the present invention.

Illustrative steps involved in clearing an array 22 of configuration random-access memory elements 20 of the type shown in FIG. 5 are shown in FIG. 10.

At step 130, the device 10 is powered down. This takes voltage Vcc to 0 volts. When Vcc on the positive power supply terminal of transistor 92 falls to 0 volts, the body B of transistor 92 falls to a voltage that is lower than the data node D (when D is a logic one that needs to be cleared). This forward biases the p-n junction between drain DR and body B (step 132).

At step 134, capacitor 84 discharges through the forward-biased junction in transistor 92 that was created during step 132. Tap T in transistor 94 serves to remove carriers that are injected by the forward-biased p-n junction, thereby preventing a latch up condition from developing in the transistors.

At step 136, device 10 may be powered up. During power up, power is applied to terminals 96, thereby powering up cross-coupled inverters 90 and 100. Capacitor 84 is connected to the D node, on the left side of cross-coupled inverters 90 and 100, whereas no comparable capacitance is present on node ND the right side of cross-coupled inverters 90 and 100. As a result, cross-coupled inverters are unbalanced. During power up, the presence of capacitor 84 ensures that the voltage on node ND rises faster than the voltage on node D. When the device is fully powered up, all of the nodes D will be at zero volts (i.e., in a cleared state).

The foregoing is merely illustrative of the principles of this invention and various modifications can be made by those skilled in the art without departing from the scope and spirit of the invention.

What is claimed is:

1. A memory element comprising:
an address transistor having a gate coupled to an address line, having a first source-drain coupled to a data line, and having a second source-drain coupled to a data node;
a capacitor coupled between a capacitor ground terminal and the second source-drain, wherein charge stored on the capacitor represents data on the data node;
first and second cross-coupled inverters, wherein the first inverter has an output coupled to the data node and has an input, wherein the second inverter has an input coupled to the data node and has an output, and wherein one of the first and second cross-coupled inverters comprises an n-channel metal-oxide semiconductor transistor having a p+ tap operable to remove injected carriers to avoid creating a latch-up condition; and
an output line that is coupled to the data node, wherein the first inverter comprises a p-channel metal-oxide-semiconductor transistor and the n-channel metal-oxide-semiconductor transistor that has the p+ tap coupled in series between a first positive power supply terminal and a first ground terminal, wherein the second inverter comprises a p-channel metal-oxide-semiconductor transistor and an n-channel metal-oxide-semiconductor transistor coupled in series between a second positive power supply terminal and a second ground terminal, and wherein the memory element further comprises a conductive line that couples the input of the first inverter to the output of the second inverter.

2. The memory element defined in claim 1 further comprising a clear transistor having a gate coupled to a clear line.

3. The memory element defined in claim 1, wherein the memory element comprises a configuration random access memory element and wherein the output line is operable to provide a static output control signal that configures programmable logic.

4. The memory element defined in claim 1 further comprising a clear transistor having a gate coupled to a clear line, having a first source-drain terminal coupled to ground, and having a second source-drain terminal coupled to the output of the second inverter.

5. The memory element defined in claim 1, wherein the address transistor, the n-channel metal-oxide-semiconductor transistors, and the p-channel metal-oxide-semiconductor transistors are formed from a semiconductor substrate, and wherein the capacitor comprises a metal-insulator-metal capacitor formed in a dielectric layer above at least some of transistors in the substrate.

6. The memory element defined in claim 1 wherein the output line comprises a metal line of at least 2 microns in length and wherein the first and second inverters are coupled to the output line at a distance of at least 2 microns from the capacitor.

7. The memory element defined in claim 1, wherein the address transistor comprises an n-channel metal-oxide-semiconductor transistor.

8. The memory element defined in claim 7, wherein the memory element operates on an integrated circuit powered using a core power supply level, and wherein the first and second positive power supply terminals are operable to supply a positive power supply voltage that is elevated with respect to the core power supply level.

9. The memory element defined in claim 1 further comprising a clear transistor having a gate coupled to a clear line, wherein the memory element comprises a configuration random access memory element and wherein the output line is operable to provide a static output control signal that configures programmable logic.

10. The memory element defined in claim 1, wherein the capacitor comprises a metal-insulator-metal capacitor.

11. The memory element defined in claim 1, wherein the memory element comprises a configuration random access memory element.

12. The memory element defined in claim 1, wherein the output line is operable to provide a static output control signal that configures programmable logic.

13. The memory element defined in claim 1 further comprising a clear transistor having a gate coupled to a clear line, having a first source-drain terminal coupled to ground, and having a second source-drain terminal coupled to the output of the second inverter, wherein the memory element comprises a configuration random access memory element.

14. The memory element defined in claim 1 further comprising a clear transistor having a gate coupled to a clear line, having a first source-drain terminal coupled to ground, and having a second source-drain terminal coupled to the output of the second inverter, wherein the memory element comprises a configuration random access memory element and wherein the output line is operable to provide a static output control signal that configures programmable logic.

15. The memory element defined in claim 1, wherein the memory element comprises a configuration random access memory element, wherein the output line is operable to provide a static output control signal that configures programmable logic, wherein the memory element operates on an integrated circuit powered using a core power supply level, and wherein the first and second positive power supply terminals are operable to supply a positive power supply voltage that is elevated with respect to the core power supply level.

16. A method of clearing a memory element that has a capacitor coupled to a data node and first and second cross-coupled inverters, wherein the first inverter has an n-channel metal-oxide-semiconductor transistor with a source-drain terminal coupled to the data node and a body terminal and wherein the n-channel metal-oxide-semiconductor transistor comprises a p+ tap, the method comprising the steps of:
  powering down the memory element so that the source-drain terminal is at a higher voltage than the body terminal and the capacitor discharges through the n-channel metal-oxide-semiconductor transistor;
  as the capacitor discharges, using the p+ tap to remove injected carriers to avoid creating a latch up condition; and
  using the capacitor to unbalance the first and second inverters as the memory element is powered up so that the data node is powered up in a cleared state, wherein powering down the memory element comprises:
  reducing a power supply voltage to zero, wherein the n-channel metal-oxide-semiconductor transistor has a third terminal that is coupled to a power supply terminal that receives the power supply voltage.

17. The method defined in claim 16, further comprising:
  powering up the memory element so that the power supply voltage is brought from zero to a positive power supply voltage.

18. The method defined in claim 16, wherein the capacitor comprises a metal-insulator-metal capacitor, the method further comprising:
  powering up the memory element, wherein the power supply voltage is increased from zero to a positive power supply voltage.

19. The method defined in claim 16, wherein the memory element comprises a configuration random access memory element, the method further comprising:
  powering up the memory element, wherein the power supply voltage is increased from zero to a positive power supply voltage.

20. The method defined in claim 16, wherein the memory element comprises an output line that is coupled to the data node, and wherein the output line is operable to provide a static output control signal that configures programmable logic, the method further comprising:
  powering up the memory element, wherein the power supply voltage is increased from zero to a positive power supply voltage.

* * * * *